United States Patent
Uchiyama (10) Patent No.: US 7,897,459 B2
(45) Date of Patent: Mar. 1, 2011

(54) SEMICONDUCTOR DEVICE AND MANUFACTURING METHOD THEREOF

(75) Inventor: Shiro Uchiyama, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 552 days.

(21) Appl. No.: 11/857,286

(22) Filed: Sep. 18, 2007

(65) Prior Publication Data

US 2008/0079112 A1    Apr. 3, 2008

(30) Foreign Application Priority Data

Sep. 28, 2006  (JP) .............................. 2006-265270

(51) Int. Cl.
*H01L 21/336* (2006.01)

(52) U.S. Cl. .............. 438/268; 438/270; 438/272; 438/369; 257/330; 257/335; 257/492; 257/506; 257/E21.41; 257/E21.418; 257/E23.009; 257/E29.262

(58) Field of Classification Search .......... 438/268, 438/270, 272, 369; 257/330, 335, 492, 506, 257/E21.41, E21.418, E23.009, E29.262
See application file for complete search history.

(56) References Cited

U.S. PATENT DOCUMENTS 6,376,314 B1 *  4/2002  Jerred ................... 438/270

2008/0160697 A1 *  7/2008  Kao ...................... 438/268
2009/0174080 A1 *  7/2009  Saito et al. ............ 257/774

FOREIGN PATENT DOCUMENTS

| JP | 2003-332417 A | 11/2003 |
|---|---|---|
| JP | 2004-221350 A | 8/2004 |
| JP | 2005-38942 A | 2/2005 |
| JP | 2005-236271 A | 9/2005 |
| JP | 2005-243689 A | 9/2005 |
| JP | 2006-19431 A | 1/2006 |
| JP | 2006-19455 A | 1/2006 |
| JP | 2006-114686 A | 4/2006 |

* cited by examiner

*Primary Examiner*—Dao H Nguyen
(74) *Attorney, Agent, or Firm*—Sughrue Mion, PLLC (57) ABSTRACT

A through electrode is formed prior to fabricating a semiconductor device by using a standard manufacturing method. Aside face of the through electrode is insulated from a semiconductor substrate by an insulating film, while the top face thereof is covered with a protective insulating film. These insulating films covering the through electrode protect a conductor of the through electrode and prevent emission of a contaminant from the conductor. Standard manufacturing conditions can be applied without change.

10 Claims, 8 Drawing Sheets

SEMICONDUCTOR DEVICE AND MANUFACTURING METHOD THEREOF

This application is based upon and claims the benefit of priority from Japanese patent application No. 2006-265270, filed on Sep. 28, 2006, the disclosure of which is incorporated herein in its entirety by reference.

BACKGROUND OF THE INVENTION

1. Field of the Invention

The present invention relates to a semiconductor device, in particular, a semiconductor device having a through electrode, and a manufacturing method thereof.

2. Description of the Related Art

Recently, there is a trend of systematizing computer equipment and communication equipment. Along with this trend, semiconductor devices used in such systems have been sophisticated by increasing the scale and the degree of integration. For the purpose of reducing the size of such electronic equipment, a three-dimensional semiconductor device having laminated semiconductor chips has been developed in addition to the sophistication of the individual semiconductor devices. In such a three-dimensional semiconductor device, a plurality of semiconductor chips are stacked and connected by the wire bonding connection or flip chip connection. The stacking of the semiconductor chips makes it possible to reduce the size of the semiconductor devices further. Further, a three-dimensional semiconductor device has recently been proposed for still further reduction of the size of the semiconductor devices, in which semiconductor chips are electrically connected by the use of a through electrode extending through a semiconductor substrate.

The related semiconductor devices having a through electrode are disclosed in the following patent documents. Japanese Laid-Open Patent Publication No. 2006-19455 (Patent Document 1) discloses a multiple through electrode provided in a single hole extending through a semiconductor substrate. The multiple through electrode is comprised of a first through electrode having a cylindrical shape, a first insulating film covering the cylindrical surface of the first through electrode, a second through electrode covering the cylindrical surface of the first insulating film, and a second insulating film covering the cylindrical surface of the second through electrode. The first and second through electrodes and the first and second insulating films are formed to have a common axis. In this manner, two through electrodes, namely the first and second through electrodes can be formed in a single hole.

Japanese Laid-Open Patent Publication No. 2006-19431 (Patent Document 2) discloses a technique to form through electrodes in a small area at a high density. A silicon substrate is formed with a ring-shaped hole, and a plurality of slit-shaped holes, and these holes are filled with an insulating film and a conductor. A ring-shaped cylindrical through electrode formed on the outside is used as a first cylindrical through electrode. A plurality of stripe-shaped through electrodes are formed inside the ring-shaped first cylindrical through electrode. The stripe-shaped through electrodes are formed to extend through a silicon substrate substantially parallel to each other. The formation of the through electrodes into a stripe shape makes it possible to reduce the thickness of the conductor for filling the holes. Thus, production throughput is increased.

Japanese Laid-Open Patent Publication No. 2006-114686 (Patent Document 3) discloses a technique relating to a trench capacitor instead of a through electrode. A silicon substrate is formed with a trench, and the trench is filled with a collar insulating film and a semiconductor material containing an impurity. A connection layer is formed in a part defined by setting back the top of the collar insulating film, and a storage node electrode is formed. Although the above-mentioned Patent Documents 1 and 2 describe a fabrication method of a through electrode, they do not describe a method as a through process to manufacture a semiconductor device having a through electrode. Therefore, it is a crucial problem to establish a manufacturing method as a through process for a semiconductor device having a through electrode.

SUMMARY OF THE INVENTION

The related patent documents mentioned in the above describe a fabrication method of a through electrode, but do not describe a manufacturing method as a through process for a semiconductor device. Therefore, it is a crucial problem to establish a manufacturing method as a through process for a semiconductor device having a through electrode with minimum change in standard semiconductor device manufacturing conditions established so far.

In view of the problems described above, it is an object of the present invention to provide a manufacturing method of a semiconductor device having a through electrode with minimum change in the conventionally established semiconductor device manufacturing conditions and with a reduced number of steps, and another object is to provide a semiconductor device manufactured by such a method.

In order to achieve the objects, the present invention basically employs techniques as described below. It should be understood that various applied techniques which can be modified without departing from the scope of the inventions also fall in the scope of the present invention.

The present invention provides a manufacturing method of a semiconductor device having a through electrode, and the method includes: a trench forming step of forming a trench for through electrode formation in a semiconductor substrate; an insulating film forming step of forming a plurality of insulating films in the interior of the trench for through electrode formation; a conductor forming step of filling the interior of the trench for through electrode formation with a conductor; an etching step of etching the conductor to form a recess such that the top face of the conductor is at a lower level than the top face of the semiconductor substrate; and a protective insulating film forming step of forming a protective insulating film on the top face of the conductor.

In the semiconductor device manufacturing method according to the present invention, the plurality of insulating films formed in the insulating film forming step includes at least an oxide film and nitride film for field pattern formation.

In the semiconductor device manufacturing method according to the present invention, an isolation trench is formed in the semiconductor substrate during the etching of the conductor in the etching step.

In the semiconductor device manufacturing method according to the present invention, the bottom face of the recess formed by the etching of the conductor is at the same level as the bottom face of the isolation trench.

In the semiconductor device manufacturing method according to the present invention, the interior of the isolation trench is filled with the protective insulating film at the same time when the protective insulating film is formed on the top face of the conductor in the protective insulating film forming step.

In the semiconductor device manufacturing method according to the present invention, the conductor is polysilicon containing an impurity.

The semiconductor device manufacturing method according to the present invention further includes a step of exposing the surface of the top face of the semiconductor substrate, after the protective insulating film forming step, and forming an oxide film and nitride film for field pattern formation thereon; and an isolation step of forming an isolation trench and forming an insulating film for isolation therein.

In the semiconductor device manufacturing method according to the present invention, the bottom face of the recess formed by the etching of the conductor is at a lower level than the bottom face of the isolation trench.

In the semiconductor device manufacturing method according to the present invention, the top face of the protective insulating film formed on the top face of the conductor in the protective insulating film forming step is at a lower level than the top face of the semiconductor substrate.

A semiconductor device according to the present invention has a through electrode and is manufactured by any one of the semiconductor device manufacturing methods described above.

A semiconductor device having a through electrode according to the present invention includes: a semiconductor substrate; a conductor extending through the semiconductor substrate; an insulating film provided on a side face of the conductor for insulating the conductor from the semiconductor substrate; and a protective insulating film provided on the top face of the conductor.

In the semiconductor device according to the present invention, the protective insulating film is formed at the same time with the formation of the insulating film for isolation, and is an insulating film formed from a same material as the insulating film for isolation.

In the semiconductor device according to the present invention, an interlayer insulating film is formed on a top face of the protective insulating film.

In the semiconductor device according to the present invention, an insulating film for field pattern formation and an interlayer insulating film are stacked on the top face of the protective insulating film.

According to the manufacturing method of a semiconductor device having a through electrode of the present invention, a through electrode is formed in a semiconductor substrate prior to fabricating the semiconductor device by a standard manufacturing method. Preferably, a side wall of the through electrode has a laminate of an oxide film, a nitride film and an oxide film and is thereby insulated from the semiconductor substrate. Preferably, the top face of the through electrode is covered with a protective oxide film and a nitride film for field pattern formation.

These insulating films covering the through electrode protect a conductor of the through electrode and prevent emission of a contaminant from the conductor. Since the emission of a contaminant from the conductor can be prevented, standard manufacturing conditions can be applied without change. Since the standard manufacturing conditions can be applied, the manufacturing method according to the present invention is able to easily mass-produce a semiconductor device, and the semiconductor device according to the present invention is easy to mass-produce.

DESCRIPTION OF THE PREFERRED EMBODIMENTS

Referring to the accompany drawings, preferred embodiments of the present invention relating to a semiconductor device having a through electrode and a manufacturing method thereof will be described.

First Embodiment

A first embodiment of the present invention relates to a semiconductor device having a through electrode extending through a semiconductor substrate, the through electrode including a peripheral through electrode and a plurality of inner through electrodes. According to a manufacturing method of the invention, the through electrode is formed prior to fabrication of an ordinary semiconductor device.

Figure 1:
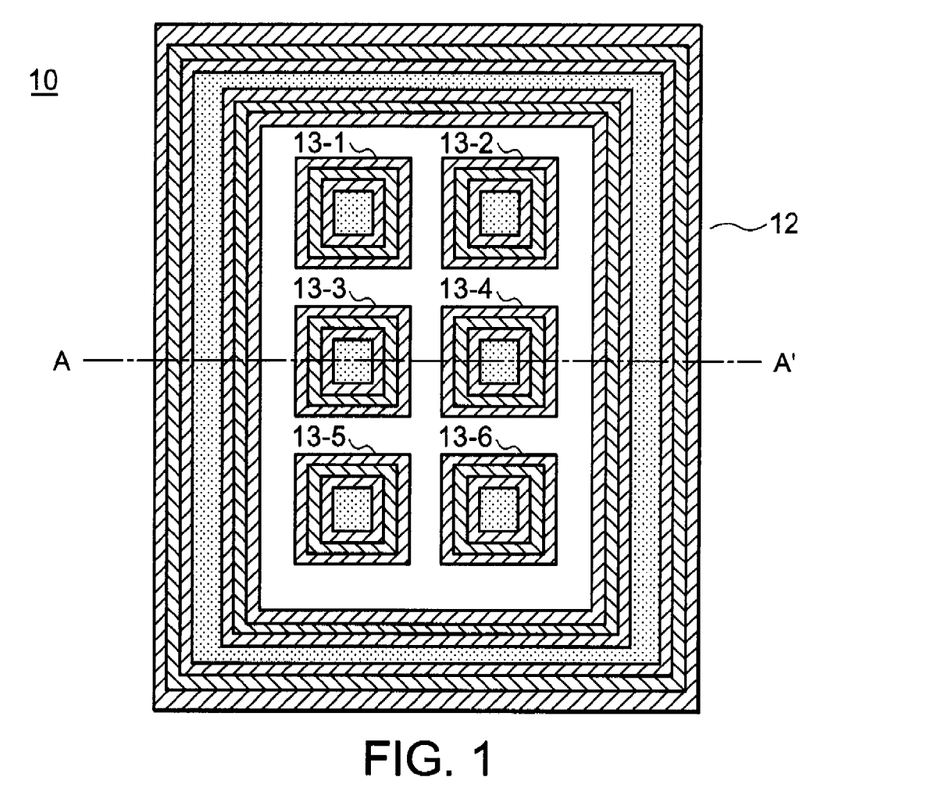
FIG. 1 is a plan view of a through electrode according to the present invention.
Figure 2:
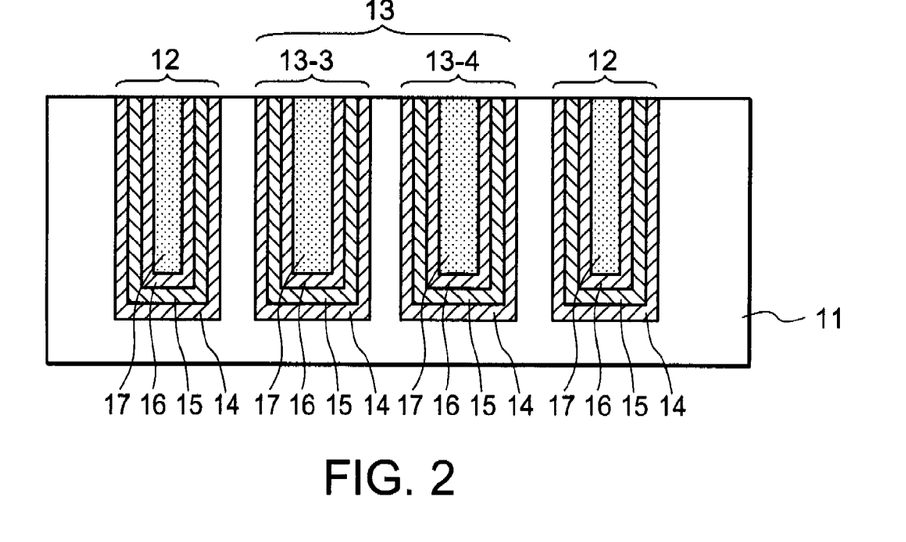
FIG. 2 is a cross-sectional view of the through electrode taken along the line A-A' of FIG. 1.

The first embodiment will be described with reference to FIGS. 1 to 6. FIG. 1 is a plan view showing the through electrode according to the present invention, and FIG. 2 is a cross-sectional view of the through electrode taken along the line A-A' of FIG. 1. FIGS. 3 to 6 are cross-sectional views illustrating principle steps of the manufacturing method of the present invention.

As shown in FIGS. 1 and 2, a through electrode 10 is comprised of a peripheral through electrode 12 and a plurality of inner through electrodes 13. The plurality of inner through electrodes 13 are arranged in matrix, and the peripheral through electrode 12 is formed to surround the inner through electrodes 13. In FIGS. 1 and 2, six inner through electrodes 13-1, 13-2, 13-3, 13-4, 13-5 and 13-6 (hereafter collectively indicated by a reference numeral 13) are provided. The number of the inner through electrodes is not particularly limited and can be set to any number.

The peripheral through electrode 12 is an isolating through electrode for reducing the parasitic capacitance generated in conjunction with a semiconductor substrate 11. The peripheral through electrode 12 is in a floating state, not being connected to an external electrode. The top and rear faces of a conductor 17 in each of the inner through electrodes 13 are connected in common to form a through electrode terminal. The reason why the inner through electrodes 13 are provided in a plurality is because the productivity can be improved. Specifically, the width of trenches to form through electrodes therein can be reduced. The reduced width of the trenches makes it possible to reduce the thickness of a film in which the trenches are buried, resulting in improvement of the productivity.

FIG. 2 is a cross-sectional view taken along the line A-A' of FIG. 1, and illustrates the peripheral through electrode 12, the inner through electrodes 13-3 and 13-4, and the peripheral through electrode 12. Each of the through electrodes is formed by forming a through electrode trench in the semiconductor substrate 11 and filling the interior of the trench with an oxide film 14, a nitride film 15, an oxide film 16, and a conductor 17. Since the peripheral through electrode 12 according to the first embodiment is in the floating state, the conductor 17 of the peripheral through electrode 12 may be replaced with an insulating film. The peripheral through electrode 12 and the inner through electrodes 13 are formed of same materials and in the same steps.

In the following description, the through electrodes 10 used as a generic name for through electrodes including the peripheral through electrode 12 and the inner through electrodes 13 will not be differentiated from the individual ones of the peripheral through electrode 12 and the inner through electrodes 13, and all these through electrodes will be simply referred as the "through electrode". In the cross-sectional views, a semiconductor substrate surface on which a device is formed, namely the upper side in the drawings is referred to as the "top face" while a semiconductor substrate surface located on the lower side of the drawings is referred to as the "rear face".

Figure 3A:
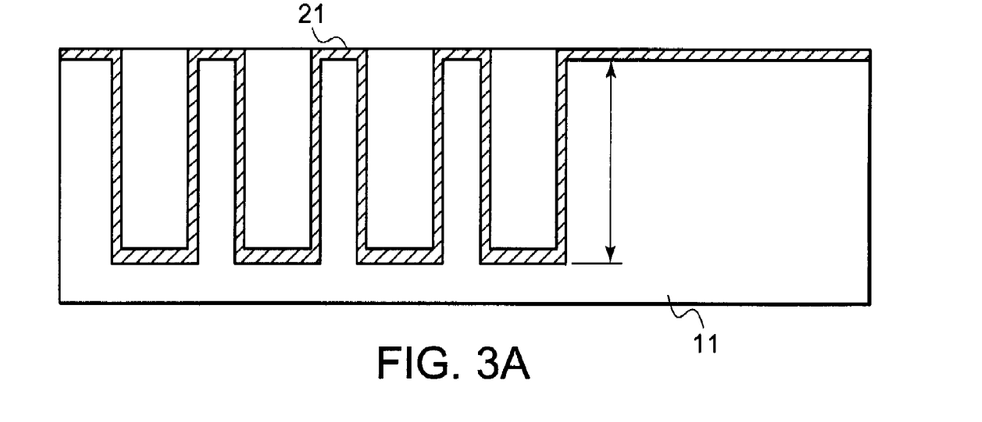
FIGS. 3A to 3C are cross-sectional views showing principal steps of a manufacturing method according to a first embodiment of the present invention.
Figure 3B:
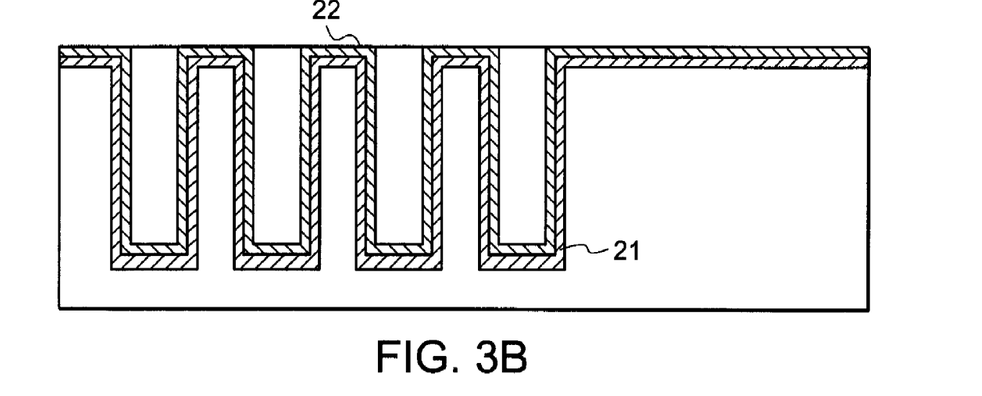
Figure 3C:
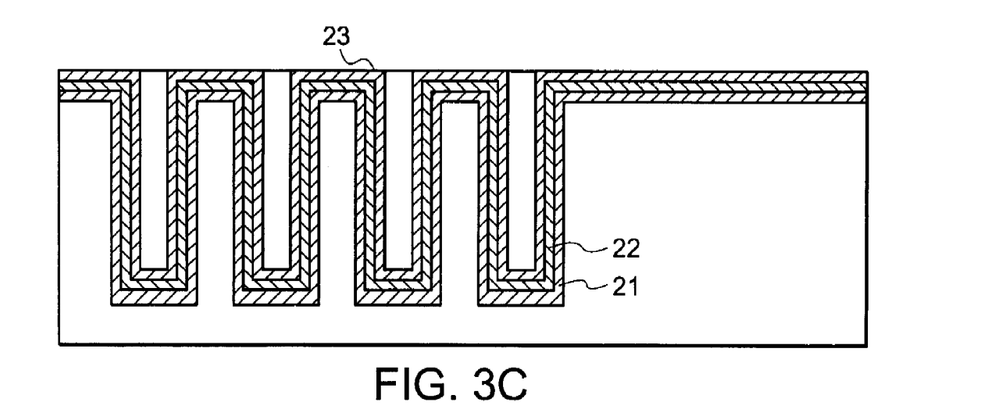

A manufacturing method of a semiconductor device having a through electrode will be described in the sequence of steps with reference to FIGS. 3 to 6. In the first step, through electrode trenches having a depth of about 50 µm are formed so that a through electrode is formed in the semiconductor substrate 11. An oxide film 21 with a thickness of 100 nm is then formed thereon as a first insulating film (FIG. 3A). A nitride film 22 with a thickness of 50 nm is formed as a second insulating film (FIG. 3B). Further, an oxide film 23 with a thickness of 400 to 500 nm is formed as a third insulating film (FIG. 3C). The total of the thicknesses of the oxide films 21 and 23 and the nitride film 22 determines a capacitance between the semiconductor substrate and the through electrode.

Figure 4A:
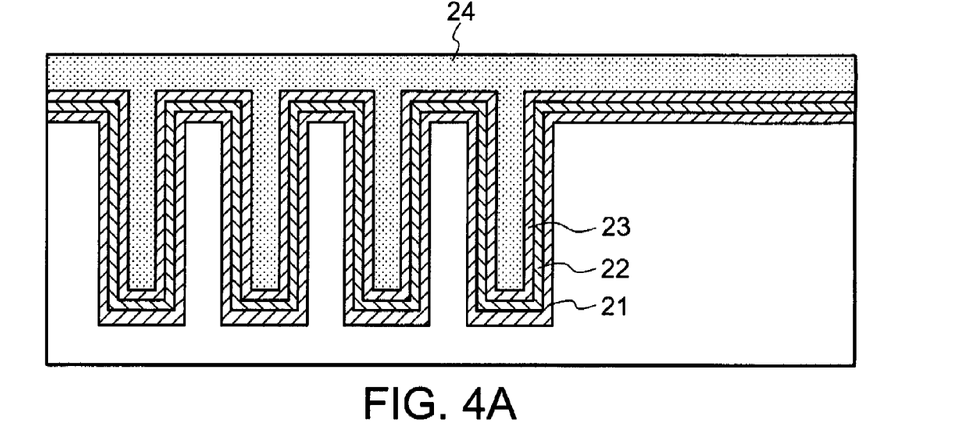
FIGS. 4A to 4C are cross-sectional views showing subsequent principal steps of the manufacturing method according to the first embodiment.
Figure 4B:
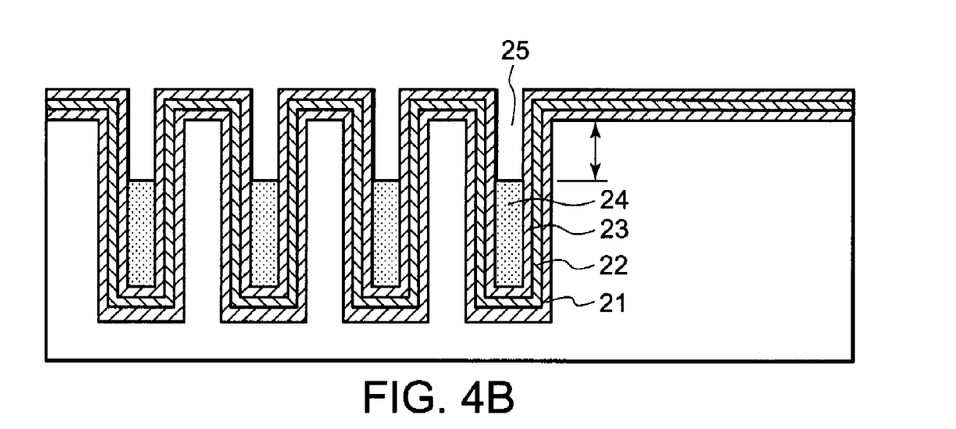
Figure 4C:
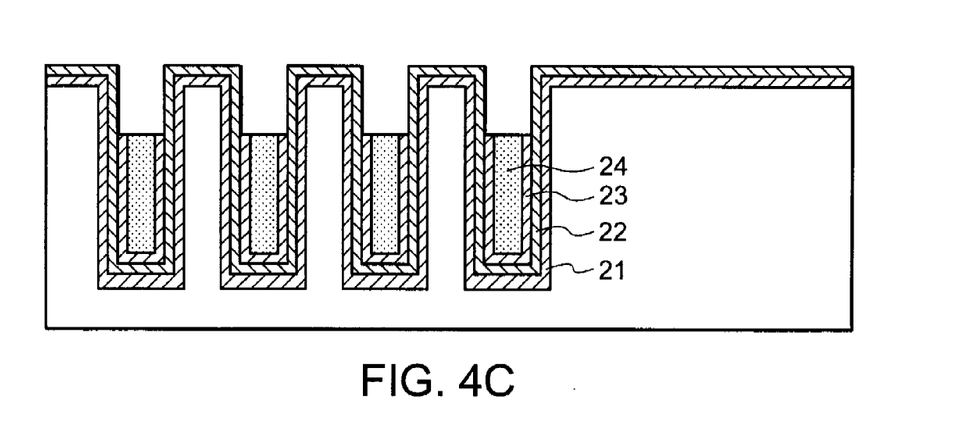

Each of the trenches is filled with a conductor 24 (FIG. 4A), and the conductor 24 is flattened. The conductor 24 is etched back to a depth of about 200 to 300 nm from the top face of the semiconductor substrate to form a recess 25 (FIG. 4B). The depth of the recess 25 is set greater than the depth of a shallow trench isolation (STI) trench so that the surface of the conductor 24 is covered sufficiently with a protective oxide film to be described later. For example, the conductor 24 may be formed by using polysilicon containing an impurity. The upper part of the oxide film 23 is then removed (FIG. 4C).

Figure 5A:
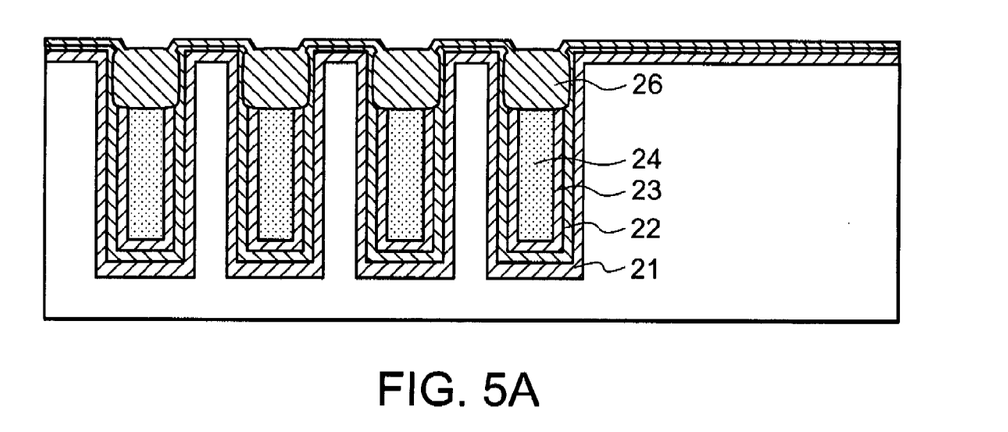
FIGS. 5A to 5C are cross-sectional views showing subsequent principal steps of the manufacturing method according to the first embodiment.

The recess 25 is filled with a protective oxide film 26 (FIG. 5A). The level of the top face of the protective oxide film 26 is equal to or lower than the level of the top face of the semiconductor substrate 11. The protective oxide film 26 can be formed by thermal oxidation. During this process, most of the thickness of the nitride film 22 exposed to the top face is converted into an oxide film by the thermal oxidation. The protective oxide film 26 is a film for protecting the conductor 24 during formation of an ordinary semiconductor device to be described later, and also functions as a shielding film to block a contaminant emitted by the conductor 24.

Figure 5B:
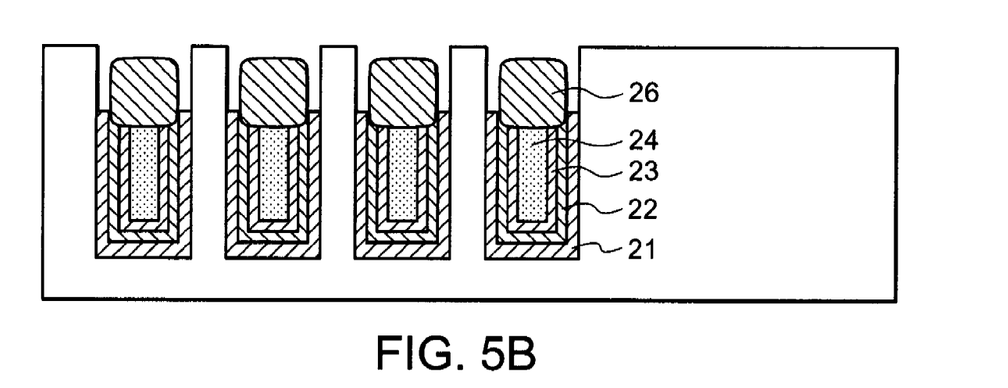
Figure 5C:
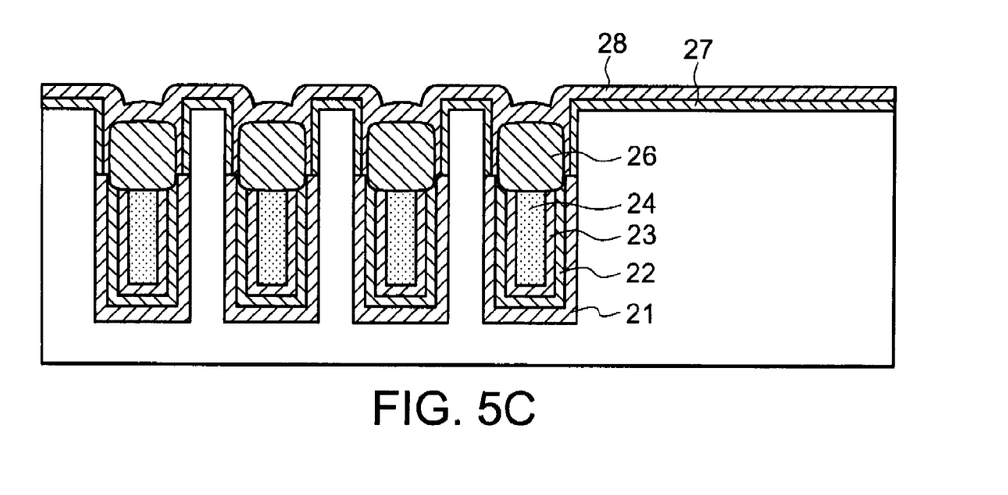

The protective oxide film 26, the nitride film 22, and the oxide film 21 formed on the upper surface of the semiconductor substrate 11 are removed to expose the surface of the semiconductor substrate 11 (FIG. 5B). This state of the semiconductor substrate 11 with the surface thus exposed is equivalent to the original state of a standard semiconductor device. From this step onward, a semiconductor device can be manufactured according to standard manufacturing processes. An oxide film 27 having a thickness of 5 to 15 nm and a nitride film 28 having a thickness of 100 to 200 nm are formed to stack together for field pattern formation (FIG. 5C). The formation of the field patterns separates active region from insulating regions (non-active region). The oxide film 27 and the nitride film 28, which are films for field pattern formation, are also referred to as the field oxide film and the field nitride film, respectively.

Figure 6A:
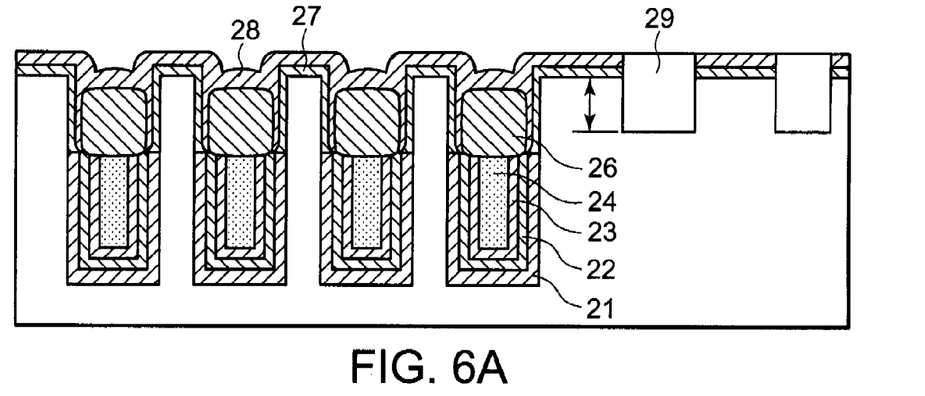
FIGS. 6A to 6C are cross-sectional views showing subsequent principal steps of the manufacturing method according to the first embodiment.
Figure 6B:
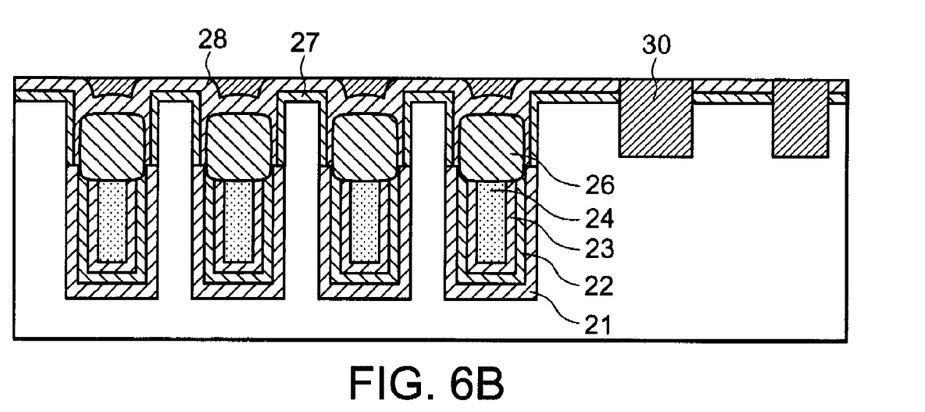

An isolation trenches 29 having a depth of 200 nm are formed (FIG. 6A). After forming a thin thermal oxide film (not shown), an insulating oxide film 30 is formed to fill the isolation trenches 29 therewith. The surface of the insulating oxide film 30 is then flattened by chemical mechanical polishing (CMP) (FIG. 6B). Since the top face of the through electrode is located at a lower level than the top face of the semiconductor substrate 11, the insulating oxide film 30 is partially left and unetched by this CMP.

Thereafter, the nitride film 28 and the oxide film 27 for field pattern formation are removed to expose the surface portions of the semiconductor substrate 11 where active regions are to be formed. The nitride film 28 and the oxide film 27 within the through electrode are left and unremoved since they are covered with the remaining portion of the insulating oxide film 30. Preferably, the level of the top face of the nitride film 28 within the through electrode is substantially the same as the level of the exposed surface of the semiconductor substrate. When the surface level of the through electrode is the same as the surface level of the semiconductor substrate 11, the surface can be flattened. Consequently, standard manufacturing conditions can be applied without change.

Figure 6C:
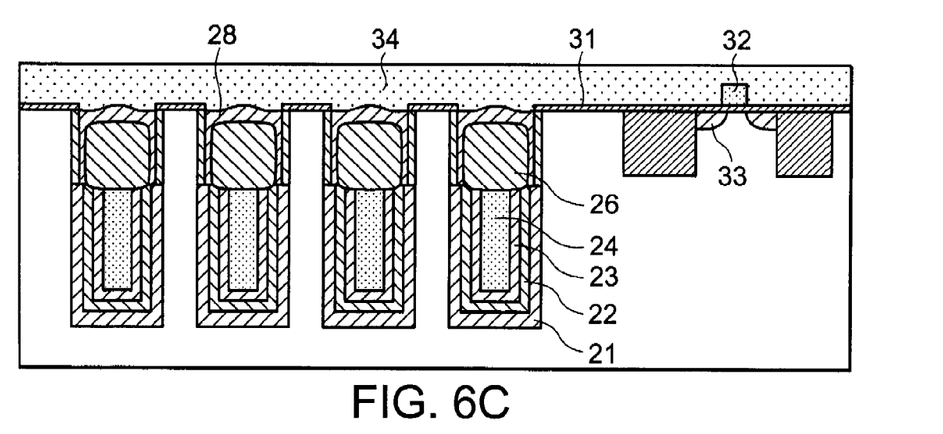

A gate insulating film 31 is then formed on the exposed surface of the semiconductor substrate 11, and a gate electrode 32 is formed. A diffusion layer 33 is formed, and an interlayer insulating film 34 is formed on the entire surface of the semiconductor substrate 11 (FIG. 6C). The protective oxide film 26 and the field pattern nitride film 28 are stacked on the top of the through electrode to form a protective insulating film of the through electrode. Although description of the subsequent steps is omitted, it is obvious that the standard manufacturing conditions can be applied to manufacture the semiconductor device. As the final step of manufacture of the semiconductor device, the semiconductor substrate 11 is ground from the rear face, and wirings are formed for connection from the top and rear faces to the inner through electrodes. The peripheral through electrode is set in the floating state without being connected to an external wiring.

In the manufacturing method of a semiconductor device having a through electrode according to the first embodiment, a through electrode is formed in a semiconductor substrate 11 prior to forming a semiconductor device by using a standard manufacturing method. The through electrode has a laminate of an oxide film 21, a nitride film 22, and an oxide film 23 on a side face thereof to be insulated from the semiconductor substrate 11. The top face of the through electrode is covered with a protective oxide film 26 and a nitride film 28 for field pattern formation. The coverage with these insulating films protects the conductor 24 of the through electrode and prevents emission of a contaminant from the conductor 24. Since contamination from the conductor 24 can be prevented, the standard manufacturing conditions can be applied to the manufacture without change. Thus, the manufacturing method according the first embodiment makes it easy to mass-produce semiconductor devices.

Second Embodiment

Figure 7A:
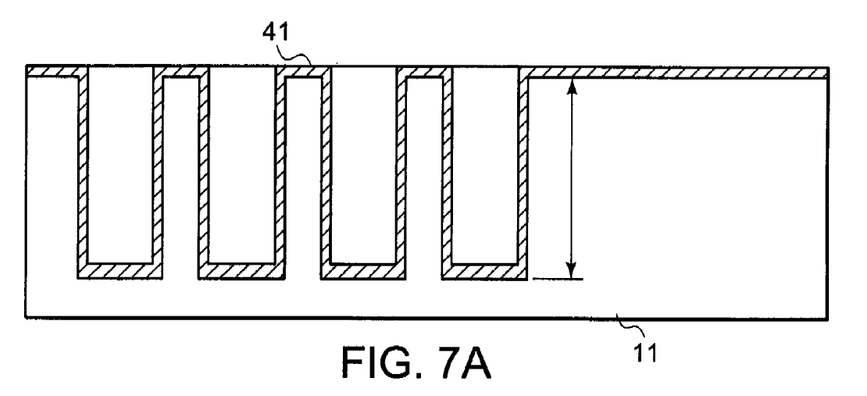
FIGS. 7A to 7C are cross-sectional views showing principal steps of a manufacturing method according to a second embodiment.
Figure 7B:
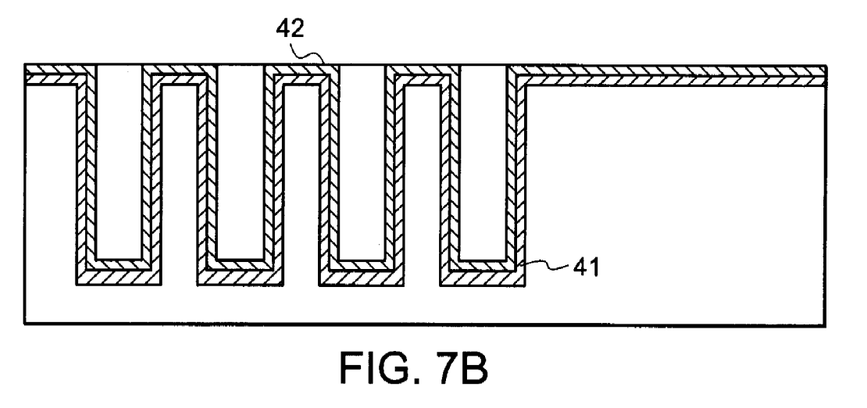
Figure 7C:
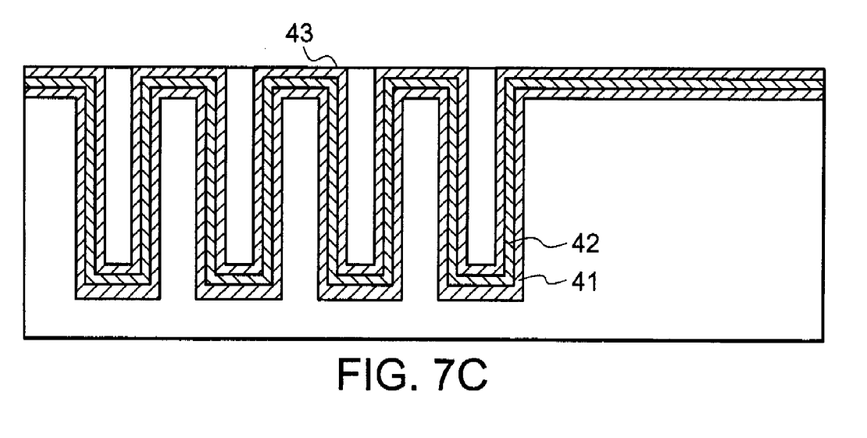
Figure 8A:
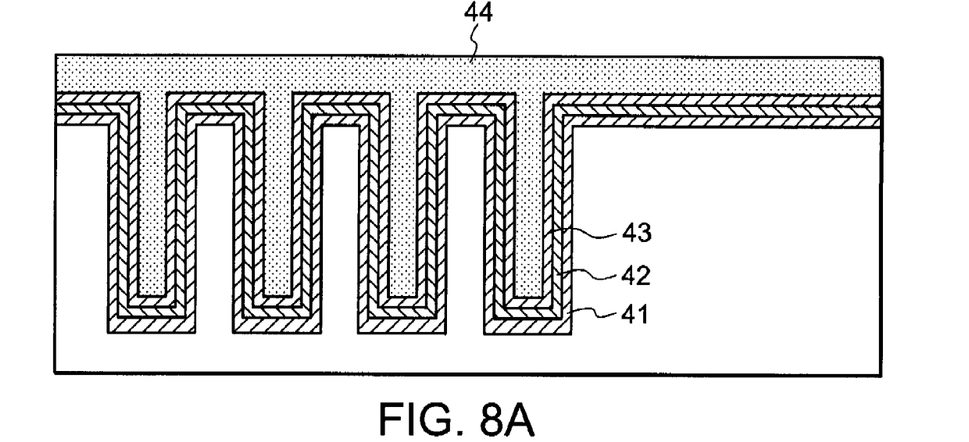
FIGS. 8A to 8C are cross-sectional views showing subsequent principal steps of the manufacturing method according to the second embodiment.
Figure 8B:
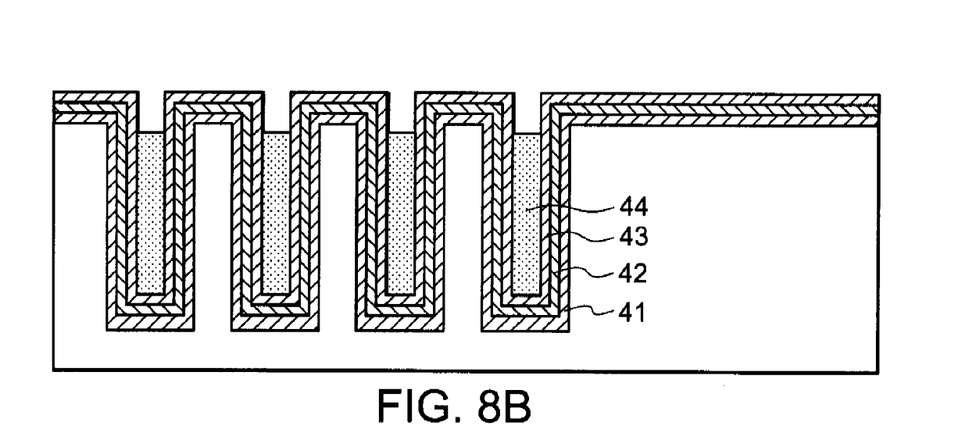
Figure 8C:
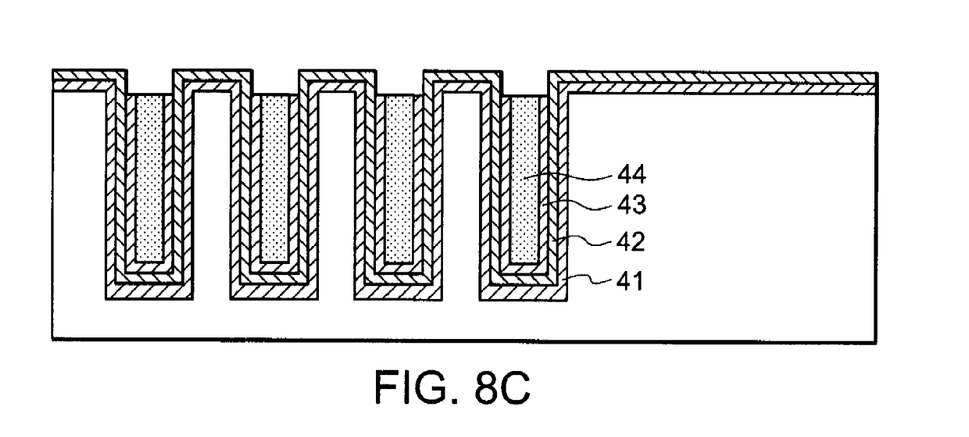
Figure 9A:
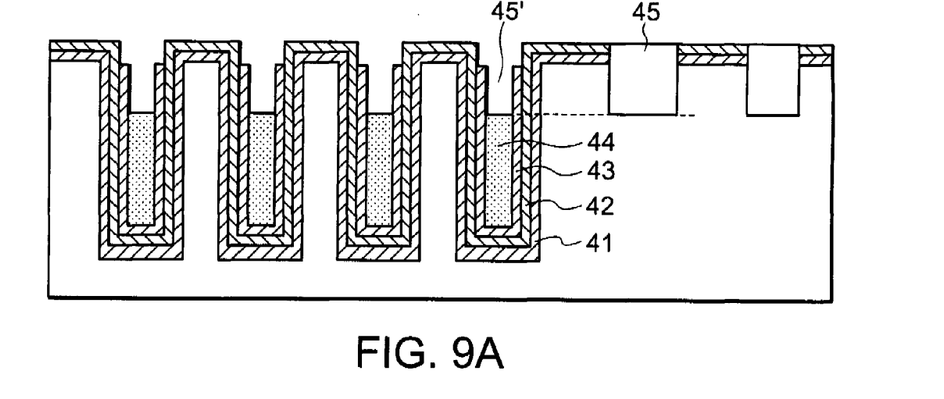
FIGS. 9A to 9C are cross-sectional views showing subsequent principal steps of the manufacturing method according to the second embodiment.
Figure 9B:
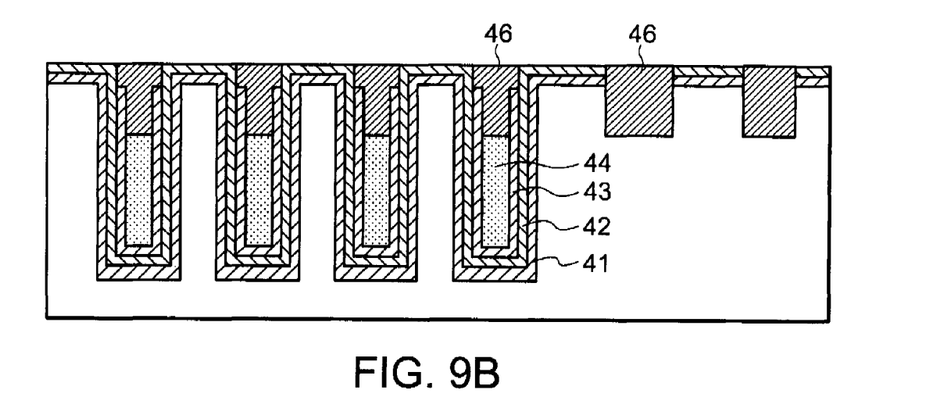
Figure 9C:
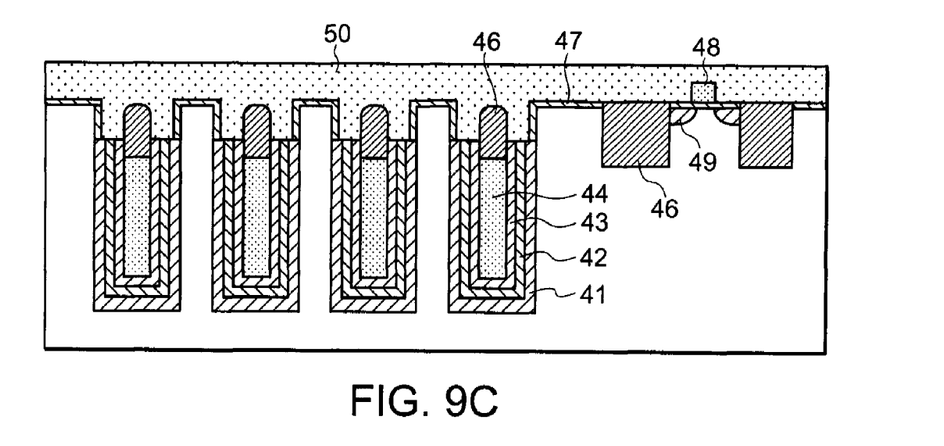

A semiconductor device and a manufacturing method thereof according to a second embodiment of the present invention will be described with reference to FIGS. 1 and 2 and FIGS. 7, 8 and 9. FIG. 1 is a plan view of a through electrode, and FIG. 2 is a cross-sectional view of the through electrode taken along the line A-A' of FIG. 1. FIGS. 7 to 9 are cross-sectional views showing principal steps of the manufacturing method.

This second embodiment is an improvement of the first embodiment, in which the number of steps is further reduced while applying the standard manufacturing conditions. Also in the second embodiment, the through electrode is formed as shown in FIGS. 1 and 2 prior to forming an ordinary semiconductor device.

Configuration of the through electrode shown in FIGS. 1 and 2 is the same as that of the first embodiment. Therefore, description thereof will be omitted. The manufacturing method of the second embodiment will be described in the sequence of steps.

In the first step, through electrode trenches having a depth of about 50 μm are formed in a semiconductor substrate 11 to form a through electrode therein. An oxide film 41 having a thickness of 5 to 15 nm is then formed as a first insulating film (FIG. 7A). A nitride film 42 having a thickness of 100 to 200 nm is formed as a second insulating film (FIG. 7B). It is important that the thicknesses of the oxide film 41 and the nitride film 42 are the same as those of an oxide film and nitride film for field pattern formation in a standard semiconductor device. By setting the thicknesses of the oxide film 41 and nitride film 42 the same as standard thicknesses of the films for field pattern formation, it is made possible to apply the standard manufacturing conditions when forming STIs without change. Further, an oxide film 43 having a thickness of 400 to 500 nm is formed as a third insulating film (FIG. 7C).

The through electrode trenches are filled with a conductor 44 (FIG. 8A). The conductor 44 is flattened, and then any trace of the conductor 44 left on the top face of the semiconductor substrate 11 is removed by etching. This etching sets back the surface of the conductor 44 slightly from the level of the top face of the semiconductor substrate 11 (FIG. 8B). The surface of the conductor 44 is recessed into the through electrode with a distance corresponding to the total thickness of the oxide film 41, nitride film 42, and oxide film 43, so that the surface of the conductor 44 is at the same level as the top face of the semiconductor substrate 11. By setting the surface of the conductor 44 at the same level as the top face of the semiconductor substrate 11, it is made possible to form STI trenches having a same depth as the etching depth of the conductor 44, as to be described later. For example, the conductor 44 may be formed by using polysilicon containing an impurity. The upper part of the oxide film 43 is then removed (FIG. 8C).

In the manufacturing method of the first embodiment, subsequently, the protective oxide film 26 is formed, the nitride film 22 and oxide film 21 are removed, and the oxide film 27 and nitride film 28 for field pattern formation are formed, as shown in FIGS. 5A, 5B and 5C. In the manufacturing method of the second embodiment, however, the oxide film 41 and nitride film 42 for field pattern formation have already been formed. Therefore, the steps of FIGS. 5A, 5B and 5C of the first embodiment can be omitted, resulting in shortening the manufacturing process. Consequently, the manufacturing method according to the second embodiment does not include the steps corresponding to those of FIGS. 5A, 5B and 5C, and the step which comes next is a step shown in FIG. 9A.

STI trench patterns are patterned. During this patterning process, a resist pattern is left and unpatterned on the entire surface of the through electrode regions. After patterning the nitride film 42 with the use of the resist pattern, the resist is removed. The oxide film 41 and the semiconductor substrate 11 laying under the same are etched by using the nitride film 42 as a hard mask. During this etching, the conductor 44 in the through electrode is simultaneously etched since no nitride film 42 is present thereon. Thus, the semiconductor substrate 11 is formed with a STI trench 45, while a recess 45' is formed by etching the top face of the conductor 44 in the through electrode. The depth of the STI trench is substantially the same as the depth of the recess 45' formed by etching the top face of the conductor 44 in the through electrode (FIG. 9A). A thin oxide film (not shown) is formed by thermal oxidation, and a trench insulating oxide film 46 is formed. The surface of the trench insulating oxide film 46 is then flattened by CMP (FIG. 9B).

Subsequently, the nitride film 42 and oxide film 41 for field pattern formation are removed from the top face of the semiconductor substrate 11 to expose active regions. The top face of the trench insulating oxide film 46 in the through electrode is at the same level as the exposed face of the semiconductor substrate 11. By setting the top face of the through electrode at the same level as the top face of the semiconductor substrate 11, it is made possible to apply the standard manufacturing conditions more easily without change. A gate insulating film 47 is formed on the exposed surface of the semiconductor substrate 11, and a gate electrode 48 is formed. A diffusion layer 49 is formed and an interlayer insulating film 50 is formed on the entire surface of the semiconductor substrate 11 (FIG. 9C). Although description of the subsequent steps will be omitted, it should be understood that the standard manufacturing conditions can be applied to the manufacture of the semiconductor device.

As the final step of the manufacture, the semiconductor substrate 11 is ground from the rear face, and wirings are formed for connection from the top and rear faces to the inner through electrodes. The peripheral through electrode is set in the floating state without being connected to an external wiring.

In the manufacturing method of a semiconductor device having a through electrode according to the second embodiment, an oxide film 41 and nitride film 42 for field pattern formation are formed on a semiconductor substrate 11, and a through electrode is formed. Thereafter, a semiconductor device is formed by a standard manufacturing method. The oxide film 41 and nitride film 42 for field pattern formation are also used as the insulating films provided on the side face of the through electrode. In this manner, the manufacturing process can be shortened. The side face of the through electrode has a laminate of a field pattern oxide film 41, a field pattern nitride film 42, and an oxide film 43, and is insulated thereby from the semiconductor substrate 11. The top face of the through electrode is covered with a trench isolation oxide film 46. By being covered with these insulating films, the conductor 44 in the through electrode is protected and emission of a contaminant from the conductor 44 can be prevented. The protection of the conductor 44 in the through electrode makes it possible to apply the standard manufacturing conditions without change. Thus, the manufacturing method according the second embodiment makes it easy to mass-produce semiconductor devices.

Although the present invention has been specifically described in its preferred embodiments, the present invention is not limited to these embodiments. It should be understood that various changes and modifications may be made without departing from the scope of the invention, and all these changes and modifications fall within the scope of the invention.

What is claimed is:

1. A method of manufacturing a semiconductor device having a through electrode, comprising:
    forming a trench for the through electrode in a semiconductor substrate;
    forming stacked insulating films on a top face of the semiconductor substrate and a side face of the trench;
    filling the trench with a conductor after forming the stacked insulating films;
    etching the conductor to form a recess so that a top face of the conductor is at a lower level than a top face of the stacked insulating films;
    removing a part of the stacked insulating films on the top face of the semiconductor substrate to expose an isolation region of the semiconductor substrate;
    removing a top portion of the conductor and the semiconductor substrate of the isolation region simultaneously; and
    forming a protective insulating film on the conductor which is remained in the trench after removing the top portion of the conductor.

2. The method according to claim 1, wherein forming the stacked insulating films comprises:
    forming a first oxide film on the semiconductor substrate;
    forming a nitride film on the first oxide film; and,
    forming a second oxide film on the nitride film.

3. The method according to claim 2, further comprising:
    removing the second oxide film over the top face of the semiconductor substrate after etching the conductor to form the recess,
    wherein the nitride film and the first oxide film are used as a mask to remove the top portion of the conductor and the semiconductor substrate of the isolation region.

4. The method according to claim 1, wherein:
    an isolation trench is formed at the isolation region by removing the semiconductor substrate.

5. The method according to claim 4, wherein:
    a remaining top face of the conductor after removing the top portion of the conductor is at the same level as a bottom face of the isolation trench.

6. The method according to claim 4, wherein:
    the isolation trench is filled with the protective insulating film at the same time when the protective insulating film is formed on the conductor.

7. The method according to claim 6, further comprising:
    after forming the protective insulating film, a top face of the protective insulating film is flattened by CMP process,
    wherein the protective insulating film is remained in the trench and the isolation trench.

8. The method according to claim 1, wherein:
    the conductor is polysilicon containing an impurity.

9. The method according to claim 1, further comprising:
    exposing the top face of the semiconductor substrate at an active region of the semiconductor device after forming the protective insulating film;
    forming a gate insulating film on the active region;
    forming a gate electrode facing the top face of the semiconductor substrate with an intervention of the gate insulating film therebetween;
    forming a diffusion layer in the active region which is not covered by the gate electrode; and
    forming an interlayer insulating film over the semiconductor substrate.

10. The method according to claim 9, further comprising:
the semiconductor substrate is ground from a rear face of the semiconductor substrate after forming the interlayer insulating film.

* * * * *